(12) United States Patent
Miyachi et al.

(10) Patent No.: US 7,659,627 B2
(45) Date of Patent: Feb. 9, 2010

(54) PHOTODIODE

(75) Inventors: Yukiya Miyachi, Kanagawa-ken (JP); Wojciech P. Giziewicz, Cambridge, MA (US); Jurgen Michel, Cambridge, MA (US); Lionel C. Kimerling, Cambridge, MA (US)

(73) Assignees: FUJIFILM Corporation, Tokyo (JP); Massachusetts Instutite of Technology, Cambridge, MA (US)

( * ) Notice: Subject to any disclaimer, the term of this patent is extended or adjusted under 35 U.S.C. 154(b) by 232 days.

(21) Appl. No.: 11/950,795

(22) Filed: Dec. 5, 2007

(65) Prior Publication Data

US 2009/0146239 A1 Jun. 11, 2009

(51) Int. Cl.
*H01L 29/41* (2006.01)
(52) U.S. Cl. .............................. 257/754; 257/E23.017; 257/E23.019

(58) Field of Classification Search ................. 257/754, 257/755, E23.017, E23.019
See application file for complete search history.

(56) References Cited

U.S. PATENT DOCUMENTS

| 5,777,390 A | 7/1998 | Berger et al. |
| 7,557,436 B2 * | 7/2009 | Mizuno et al. .............. 257/679 |
| 2003/0133066 A1 * | 7/2003 | Ono et al. .................... 349/141 |
| 2006/0103750 A1 * | 5/2006 | Iwamoto ..................... 348/311 |
| 2006/0274250 A1 * | 12/2006 | Ono et al. .................... 349/141 |

* cited by examiner

*Primary Examiner*—Allan R. Wilson
(74) *Attorney, Agent, or Firm*—Sughrue Mion, PLLC

(57) ABSTRACT

A photodiode balanced in increased sensitivity and speed. The photodiode includes a semiconductor substrate, an active region formed on the semiconductor substrate, and a comb electrode connected to the active region. The comb electrode includes a plurality of electrode fingers, and each of the electrode fingers includes a transparent electrode contacting the active region, and an opaque electrode formed on the transparent electrode. Here, the width of the opaque electrode is set smaller than the width of the transparent electrode.

10 Claims, 9 Drawing Sheets

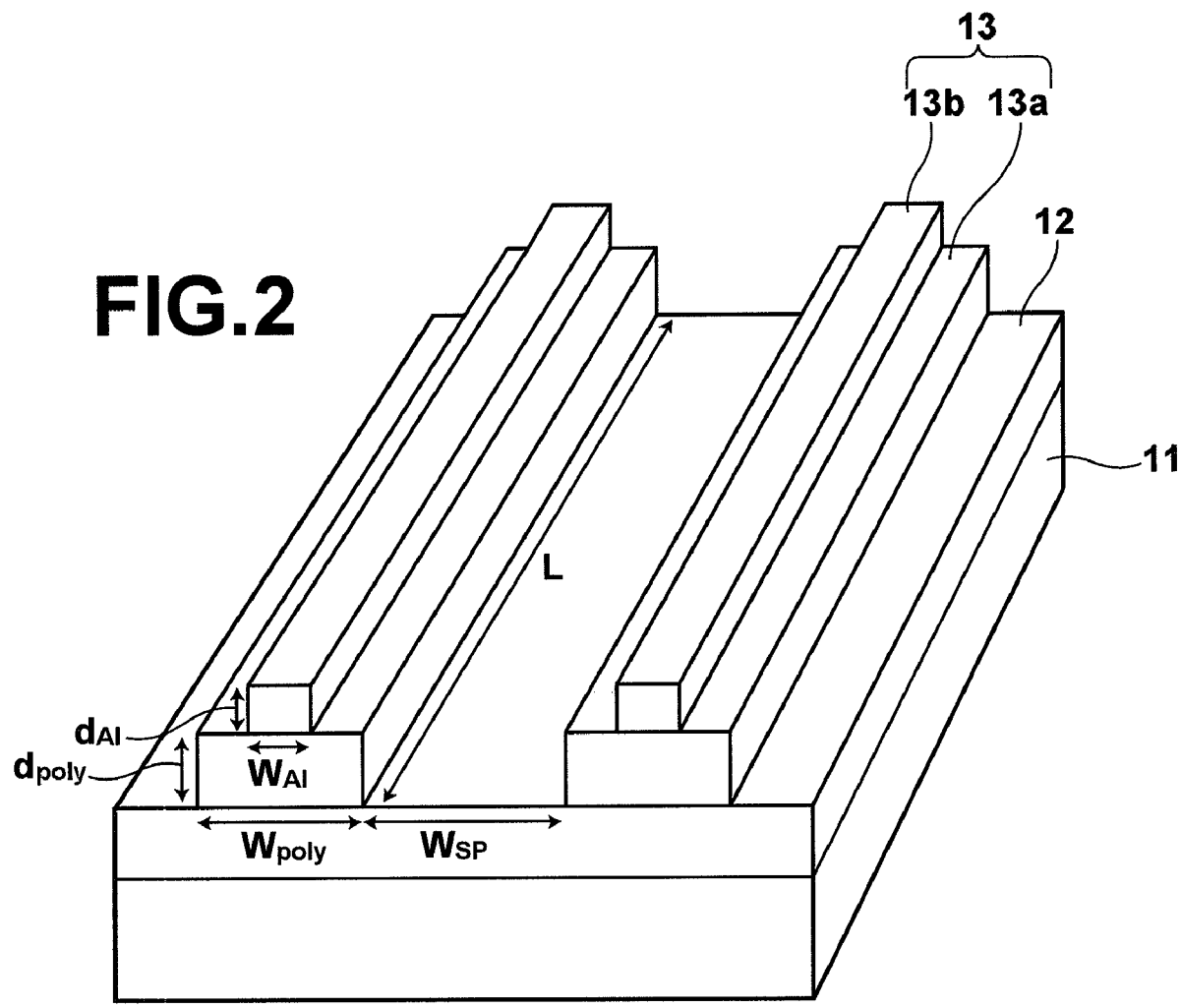

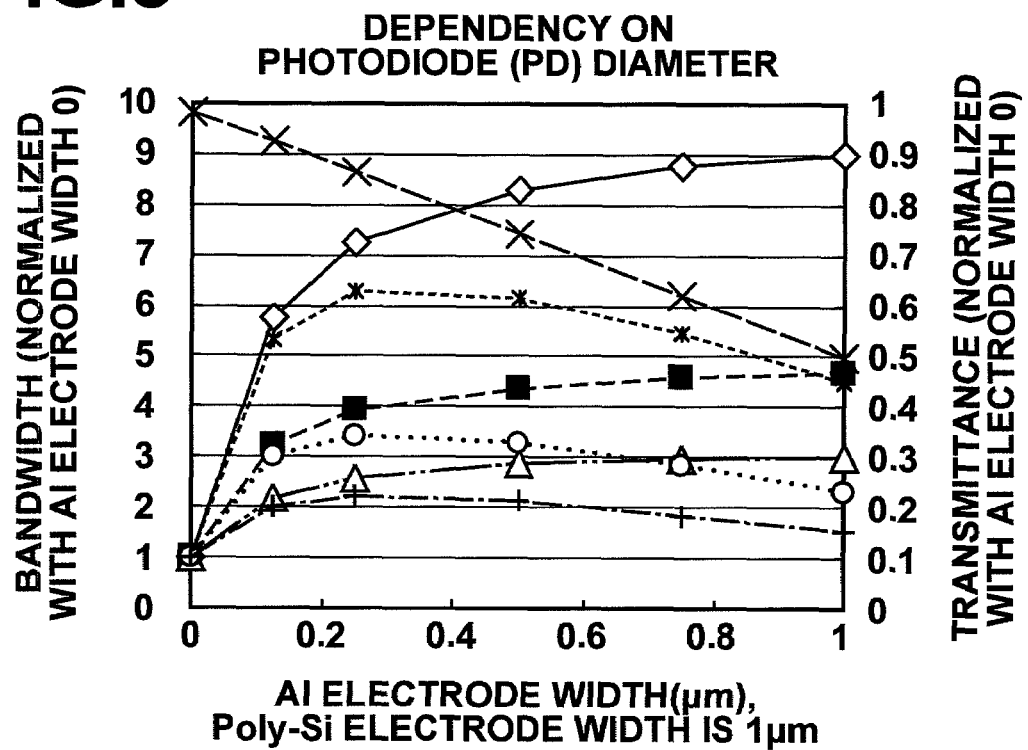

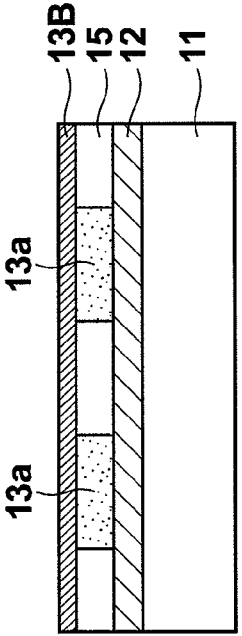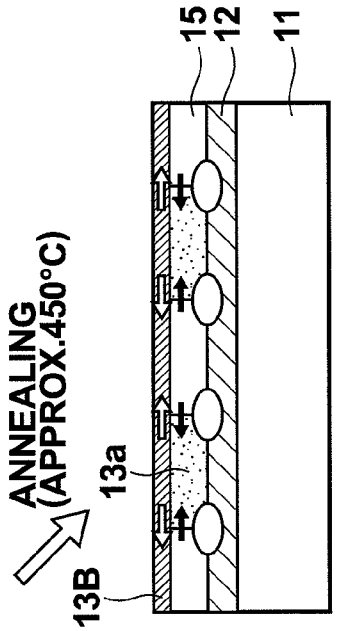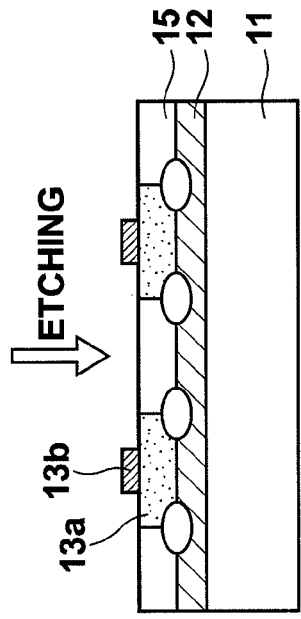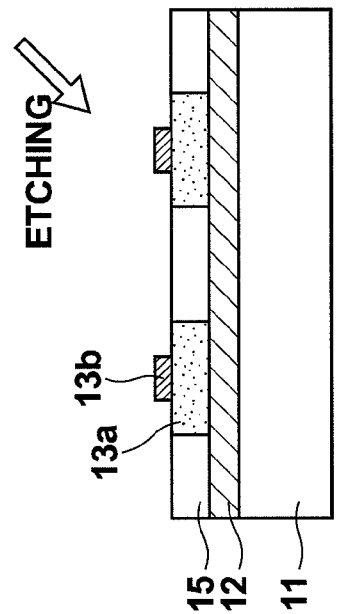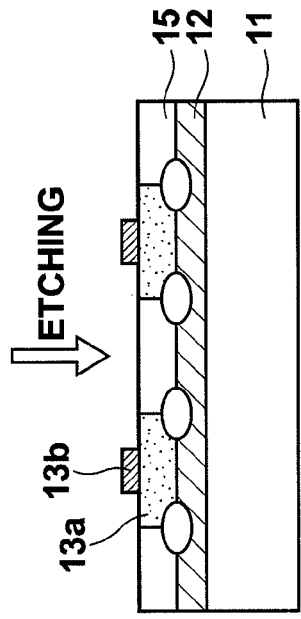

PHOTODIODE

BACKGROUND OF THE INVENTION

1. Field of the Invention

The present invention relates to a photodiode, and a method for manufacturing the same.

2. Description of the Related Art

Recently, in order to cope with a dramatic increase in the capacity of networks, epitomized by the widespread use of the Internet, development of high-speed optical transmission systems has been sought. Today, optical fibers having comparatively large apertures that facilitate alignment, such as plastic optical fibers, multimode glass optical fibers, and the like, are drawing increased attention as optical fibers for use not with trunk line systems but "last one mile" transmission systems, including subscriber line systems. As optical receivers suitable for high speed and large aperture optical fibers, MSM (metal-semiconductor-metal) photodiodes, lateral PIN photodiodes, and the like, in which electrodes are arranged laterally, i.e., in the direction parallel to the surface of the substrate in a finger pattern, are known.

Use of a transparent electrode, instead of an opaque electrode that blocks light, as the finger pattern electrode, i.e., comb electrodes is proposed, in order to further increase the sensitivity of these types of photodiodes. Generally, in a photodiode having a transparent electrode, however, the sensitivity and high-speed response become a trade-off due to (1) a large time constant arising from a high resistance value, and (2) generation of low mobility holes even under the positive electrode if the active layer is an intrinsic or lightly doped N type layer, and the travel distance of the holes becomes long. U.S. Pat. No. 5,777,390 describes a structure for improving the trade-off between the sensitivity and high-speed response. The structure described in the Patent tries to reduce the travel distance of the holes by using a transparent electrode (different in material and clearness from that of the other type of electrode) as the electrode for collecting low mobility holes, i.e., negative electrode, while preventing holes from being generated under the positive electrode by using a low resistance nontransparent electrode as the positive electrode, in order to alleviate the trade-off.

Further, in the structure described in U.S. Pat. No. 5,777, 390, use of long transparent electrodes results in high resistance, so that it is difficult to sufficiently alleviate the trade-off between the increased sensitivity and speed. That is, it is difficult to satisfy the demands of increased sensitivity and speed.

Still further, in the aforementioned structure, the transparency of the transparent electrode depends on the material, so that the transmittance is not freely (continuously) controlled. In addition, two different materials capable of satisfactorily contacting the active layer need to be used.

SUMMARY OF THE INVENTION

The present invention has been developed in view of the circumstances described above, and it is an object of the present invention to provide a photodiode, having a comb electrode structure capable of satisfactorily contacting the active layer, that may provide increased sensitivity and high-speed response. It is a further object of the present invention to provide a method for efficiently manufacturing such a photodiode.

The photodiode according to the present invention is a photodiode, including:

a semiconductor substrate;

an active region formed on the semiconductor substrate; and a comb electrode connected to the active region, wherein:

each of a plurality of electrode fingers constituting the comb electrode includes a transparent electrode contacting the active region, and an opaque electrode formed on the transparent electrode; and the width of the opaque electrode is set smaller than that of the transparent electrode.

Preferably, in the photodiode of the present invention structured in the manner as described above, the transparent electrode is made of poly-Si, and the opaque electrode is made of at least one of the materials selected from the group consisting of Al, AlSi, Ni, Ta, Cu, Ti, and TiN. When the transparent and opaque electrodes are made of the materials described above, the width of the opaque electrode is preferable to be in the range of ¼ to ¾ of the width of the transparent electrode.

Further, when the transparent and opaque electrodes are made of the materials described above, it is preferable that an active layer on which the active region is formed is made of Ge or SiGe.

Still further, when the transparent and opaque electrodes are made of the materials described above, it is preferable that a barrier layer made of Ti, TiN, or TaN, and a contact layer made of $TiSi_2$, $TaSi_2$, or $CoSi_2$ are formed between the transparent electrode and the opaque electrode.

In the mean time, the method for manufacturing a photodiode according to the present invention is a method for manufacturing the photodiode of the present invention described above, and includes the steps of:

depositing a material of the opaque electrode on the entire surface of the transparent electrode;

etching the material of the opaque electrode into a predetermined pattern; and annealing the material of the opaque electrode.

Generally, a transparent electrode has a larger specific resistance in comparison with an opaque electrode, so that formation of a comb electrode only with transparent electrodes poses a problem that it becomes difficult to achieve a high-speed response. In contrast, in the photodiode of the present invention, an opaque electrode having a smaller specific resistance is formed on such a transparent electrode, so that the overall resistance of the comb electrode that includes these electrodes becomes small, and a high-speed response is realized. In addition, the opaque electrode has a smaller width than that of the transparent electrode, the area where light is blocked by the opaque electrode is very small, thereby high sensitivity is also ensured.

BRIEF DESCRIPTION OF THE DRAWINGS

FIG. 2 is an enlarged perspective view of the photodiode shown in FIGS. 1A and 1B illustrating a portion thereof.

FIG. 8 is a graph illustrating dependency of the bandwidth and the like of the photodiode of the present invention on the light receiving diameter.

FIGS. 10A to 10E illustrate a process for manufacturing the photodiode of the present invention.

DESCRIPTION OF THE PREFERRED EMBODIMENTS

Figure 1A:
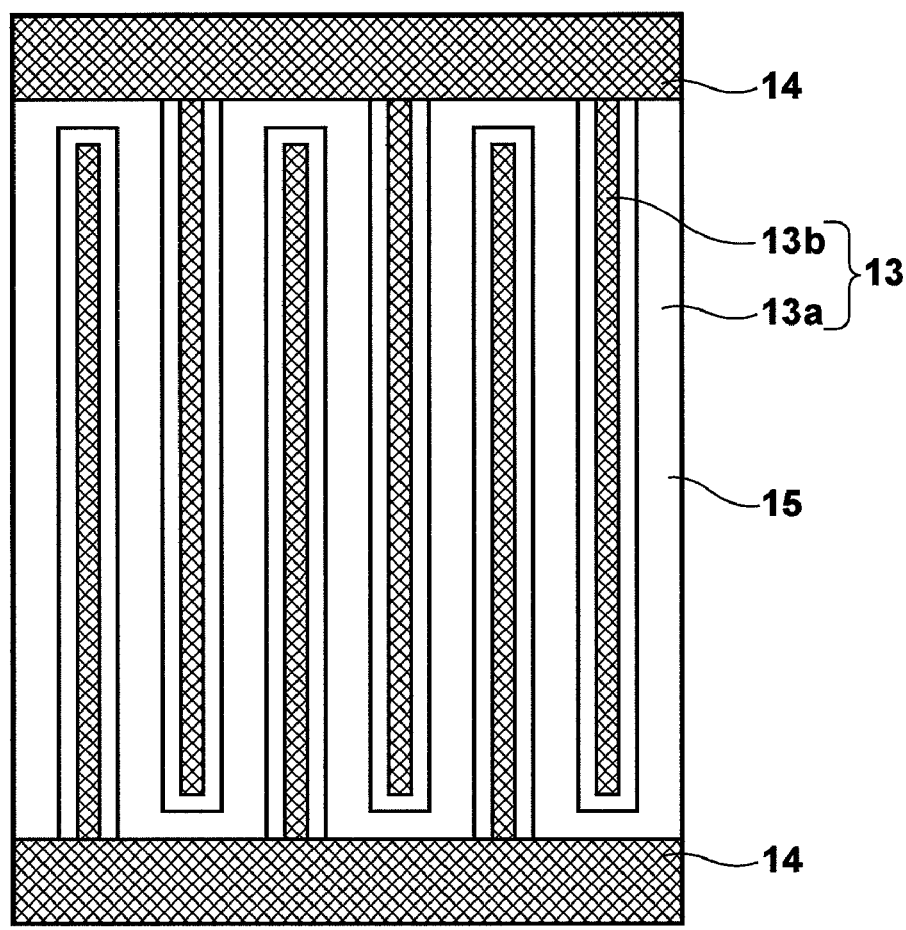
FIG. 1A is a schematic plan view of the photodiode according to an embodiment of the present invention.
Figure 1B:
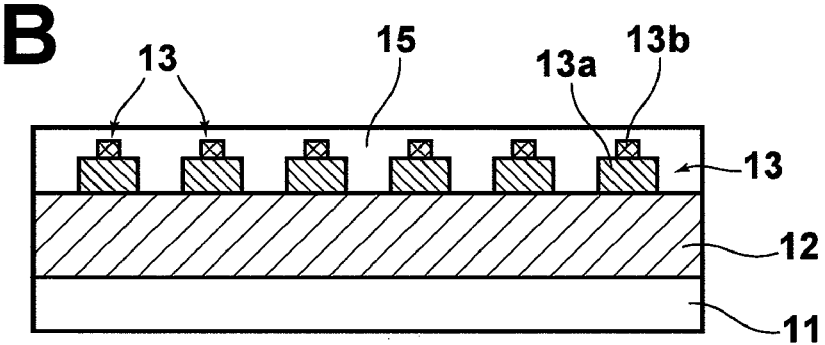
FIG. 1B is a schematic sectional elevational view of the photodiode shown in FIG. 1A.

Hereinafter, an exemplary embodiment of the present invention will be described in detail with reference to the accompanying drawings. FIGS. 1A and 1B respectively illustrate a schematic planar shape and a schematic sectional elevational shape of the photodiode 10 according to an embodiment of the present invention. The photodiode of the present embodiment is, as an example, a MSM (metal-semiconductor-metal) lateral photodiode. As illustrated, the photodiode 10 includes: a semiconductor substrate 11; an active layer 12 formed on the substrate 11; a comb electrode including a plurality of comb electrode fingers 13 arranged side by side on the active layer 12 with appropriate spacing; electrodes 14 connected to the comb electrode fingers 13; and a passivation layer 15 formed on the comb electrode fingers 13.

In FIG. 1A, the upper electrode 14 is the positive electrode and connected to a signal line, and lower electrode 14 is the negative electrode and grounded. Thus, the comb electrode fingers 13 are alternately positive and negative electrodes.

As for the semiconductor substrate 11, for example, a Si substrate is used, and the active layer 12 is a Ge film formed by epitaxial growth on the substrate 11. Each of the plurality of comb electrode fingers 13 includes a transparent electrode 13a formed on the active layer 12, and an opaque electrode 13b formed on the transparent electrode 13a, having a smaller width than that of the transparent electrode 13a, as illustrated in FIG. 2 which shows a perspective shape of the photodiode 10. Note that the passivation layer 15 is omitted in FIG. 2 for clarity.

In the present embodiment, the transparent electrode 13a is made of poly-Si, while the opaque electrode 13b is made of Al having a specific resistance smaller than that of Poly-Si. Note that Al—Si, Ni, Ta, Cu, and the like are also suitable for use as the material of the opaque electrode 13b other than Al. The poly-Si has a high transmittance of light having a wavelength of 850 nm, which is generally used for optical communications. A poly-Si layer with a thickness of 1 μm, for example, transmits 93% of 850 nm light. In addition, the poly-Si is a material most commonly used in an ordinary LSI process because of reasonable price and high reliability.

The poly-Si, the material of the transparent electrode 13a, has a specific resistance greater than that of Al, Al—Si, Ni, Ta, Cu, and the like, which are materials of the opaque electrode 13b. Formation of the comb electrode fingers 13 with only poly-Si, therefore, poses a problem that it becomes difficult to achieve a high-speed response. In the present embodiment, however, the opaque electrode 13b made of Al having a smaller specific resistance is formed on the transparent electrode 13a, so that the overall resistance of the comb electrode finger 13 becomes small, and a high-speed response is realized. In addition, the opaque electrode 13b has a smaller width than that of the transparent electrode 13a, the area where light is blocked by the opaque electrode 13b is very small, thereby high sensitivity is also ensured.

Further, Ge, the material of the active layer 12 of the present embodiment, has advantages over Si, such as higher sensitivity to 850 nm light (not less than about five times), higher mobility (about three times), and faster response capabilities. Further, the Ge has a low risk of contamination, as is evident from the fact that SiGe Bi-CMOS process has already been used in large scale commercial processes. This is particularly advantageous over GaAs of III-V family.

The photodiode 10 of the present embodiment is formed on a Si substrate, so that it is structured monolithically with electronic circuits, including TIA, limiting amplifier, and the like. The monolithic structure provides advantages, such as increased speed due to decreased distance to the TIA, low cost when mass produced.

Hereinafter, the response speed (bandwidth) and sensitivity of the photodiode 10 will be described in detail. Generally, the bandwidth of a photodiode depends on a carrier transit time and a CR time constant. A sufficiently small distance between electrodes and application of a sufficiently large voltage cause the carrier transit time to be reduced, so that it is important to reduce the RC time constant. This is particularly true of a photodiode having a relatively large aperture of not less than 50 μm.

[Response Speed (Bandwidth)]

Figures 3A, 3B, 3C:
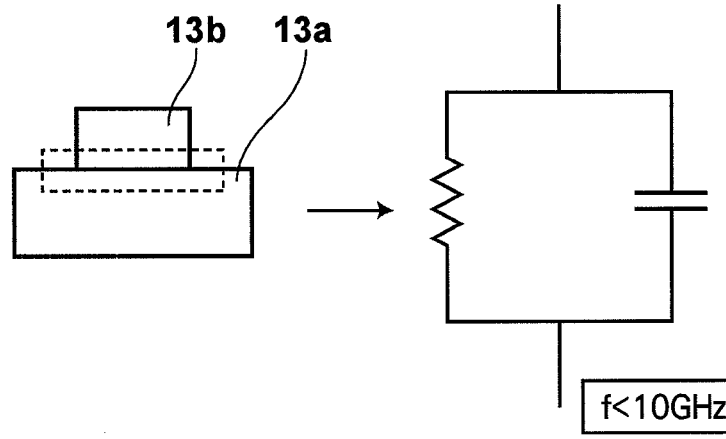
FIGS. 3A to 3C illustrate an equivalent circuit of a comb electrode finger of the photodiode shown in FIGS. 1A and 1B.

Each of the comb electrode fingers 13 of the present embodiment may be regarded as a circuit connecting the transparent electrode 13a and opaque electrode 13b, as illustrated in FIG. 3A, which may be represented as the circuit illustrated in FIG. 3B. Here, if the photodiode 10 is assumed to be used in the speed range (bandwidth of frequency f) of not greater than few dozens of GHz, as in common cases, the capacitance between the Al and poly-Si is not a predominating factor. Therefore, the comb electrode finger 13 maybe modeled as illustrated in FIG. 3C. In fact, the resistance between the Al and poly-Si is about 5Ω, and the capacitance between them is about 1 pF. Thus, there will be no problem in the aforementioned modeling under an operation speed of not greater than few dozens of GHz. Hereinafter, consideration will be given based on such modeling.

(a) When the Photodiode has a Square Shape

Here, the following parameters are used (FIG. 2).

$\rho_{Al}$: specific resistance of Al
$\rho_{poly}$: specific resistance of poly-Si
$W_{Al}$: width of Al electrode
$W_{poly}$: width of poly-Si electrode
$W_{Sp}$: spacing between poly-Si electrodes
$d_{Al}$: thickness of Al electrode
$d_{poly}$: thickness of poly-Si electrode
L: a side length of the square photodiode
$R_0$: load resistance of an external circuit
$R_{Al\text{-}poly\text{-}Ge}$: resistance between Al electrode-poly-Si electrode-Ge
$T_{poly}$: transmittance of poly-Si In this case, the bandwidth dependent on the Al-poly-Si electrode structure may be approximated by the following Formula with respect to the RC time constant.

$$BW = \frac{1}{2\pi RC} \propto \frac{1}{R_0 + 4R_{hyb}\dfrac{L}{W_{Sp} + W_{poly}}} \qquad \text{(Formula 1)}$$

-continued $$R_{hyb} \cong \rho_{Al} \frac{L}{W_{Al} d_{Al}} + R_{Al\text{-}Poly\text{-}Ge}$$

Note that the following are presumed as prerequisite conditions.

The contribution of capacitance between Al and poly-Si to the bandwidth is sufficiently small in comparison with the resistance based on f<10 GHz.

The resistance of the comb electrode finger conforms well to that of parallel resistance ("Nanoscale tera-hertz metal-semiconductor-metal photodetectors", S. Y. Chou and M. Y. Liu, IEEE Journal of Quantum Electronics, Vol. 28, Issue 10, pp. 2358-2368, 1992 and the like).

The number of comb electrode fingers is $L/2(W_{sp}+W_{poly})$

The resistance of the poly-Si electrode is sufficiently larger than that of the Al electrode, and the current flows through the Al electrode most of the region.

(b) When the Photodiode has a Circular Shape

Here, basically the similar parameters are used except that a parameter "D: a diameter of the circular photodiode" is used instead of "L: a side length of the square photodiode".

In this case, the bandwidth dependent on the Al-poly-Si electrode structure may be approximated by the following Formula with respect to the RC time constant.

$$BW = \frac{1}{2\pi RC} \propto \frac{1}{R_0 + 1/k = \sum_{k=-\frac{N_{Cr}}{2}}^{\frac{N_{Cr}}{2}} \frac{1}{R_k}} \quad \text{(Formula 2)}$$

$$N_{CR} = \begin{pmatrix} \text{Number of Comb Electrode} \\ \text{Fingers (Pairs)} \end{pmatrix}$$

$$\cong \frac{D}{2(W_{Sp} + W_{poly})}$$

$$R_k = 2\rho_{Al} \frac{2\sqrt{(D/2)^2 - \left\{\frac{(2k-1)}{(W_{Sp}+W_{poly})}\right\}^2}}{W_{Al} d_{Al}} + R_{Al\text{-}Poly\text{-}Ge}$$

Note that the following are presumed as prerequisite conditions.

The contribution of capacitance between Al-poly-Si to the bandwidth is sufficiently small in comparison with the resistance based on f<10 GHz.

The resistance of the comb electrode finger conforms well to that of parallel resistance ("Nanoscale tera-hertz metal-semiconductor-metal photodetectors", S. Y. Chou and M. Y. Liu, IEEE Journal of Quantum Electronics, Vol. 28, Issue 10, pp. 2358-2368, 1992, and the like).

The number of comb electrode fingers (pairs) may be approximated by $L/2(W_{sp}+W_{poly})$.

The resistance of the poly-Si electrode is sufficiently larger than that of the Al electrode, and the current flows through the Al electrode most of the region.

Figure 4:
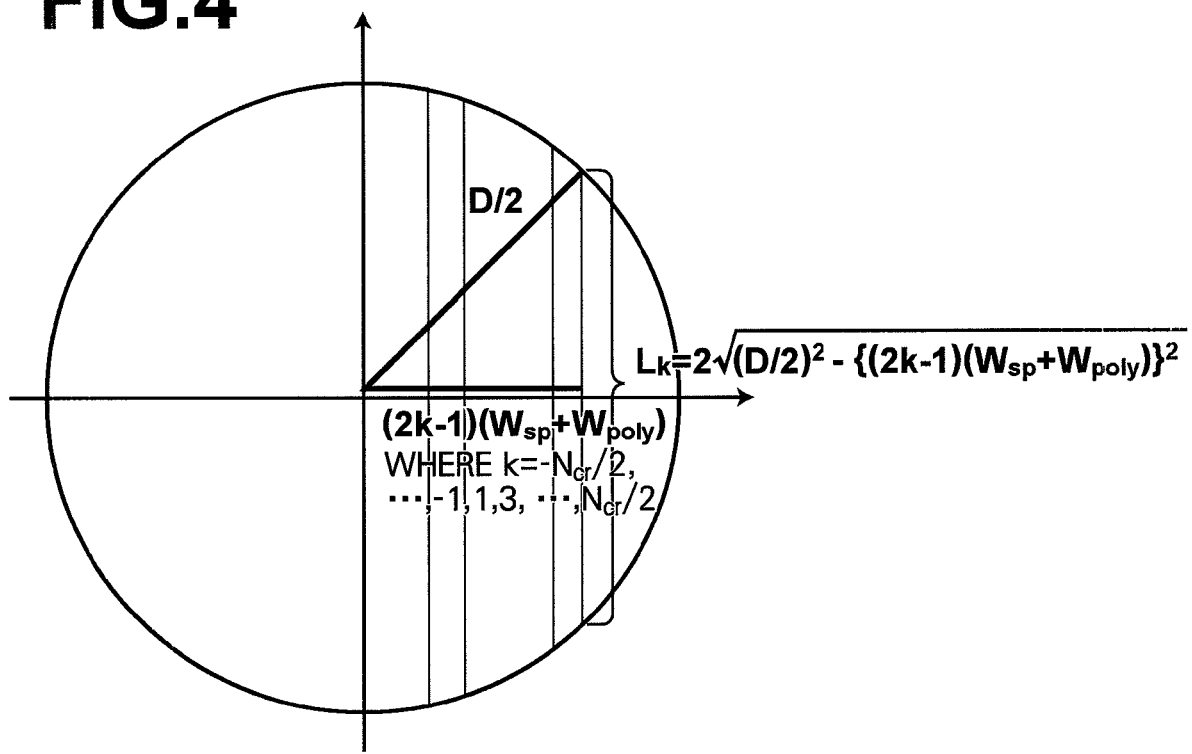
FIG. 4 illustrates lengths of comb electrode fingers of the photodiode shown in FIGS. 1A and 1B.

The Length $L_k$ of each of the comb electrodes that changes according to the location thereof on the photodiode is approximated as illustrated in FIG. 4, and the resistance of the comb electrodes is obtained based on the length $L_k$.

[Sensitivity]

In the structure of the present embodiment, the amount of light reaching the active layer 12 is decreased, and thereby the sensitivity is decreased as the width of the opaque electrode 13b is increased. That is, in the structure, the ratio Tr of the amount of light reached to the active layer 12 to the amount of light inputted is obtained by the following formula.

$$Tr = \{W_{sp} + T_{poly}(W_{poly} - W_{Al})\}/(W_{sp} + W_{poly}) \quad \text{(Formula 3)}$$

Figure 5:
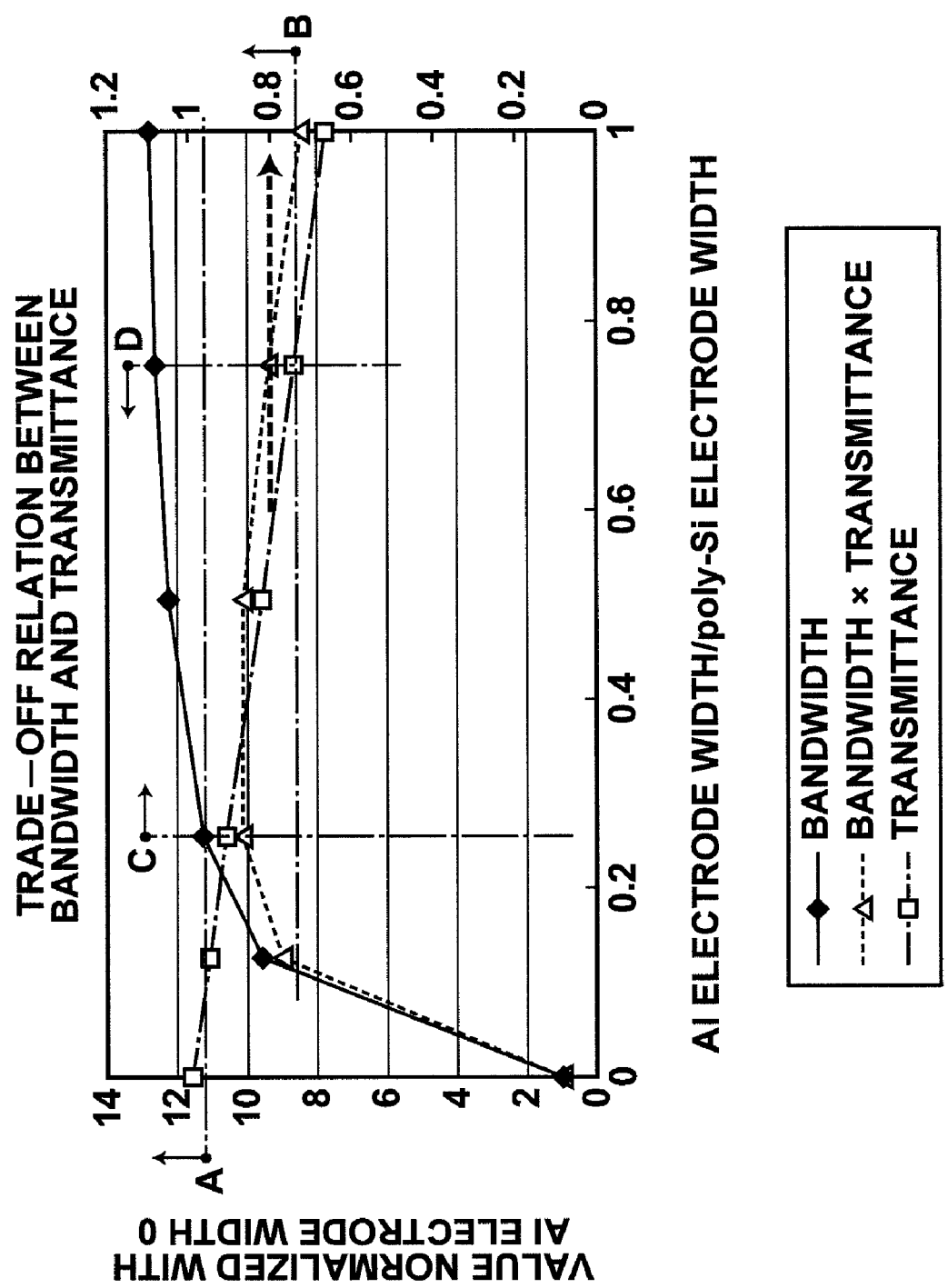
FIG. 5 is a graph illustrating the relationship between the bandwidth of the photodiode of the present invention and transmittance of the electrode.

From Formula 1 or Formula 2, and Formula 3, the relationship between the response speed and sensitivity with respect to the width of the opaque electrode (Al electrode) is typically like that as illustrated in FIG. 5. That is, there exists a trade-off in which the sensitivity is decreased while response speed is increased as the ratio of the width of the opaque electrode to that of the transparent electrode (poly-Si electrode) becomes great. Note that "bandwidth" and "bandwidth×transmittance" are indicated by the left vertical axis, and the "transmittance" is indicated by the left vertical axis in FIG. 5 (the same applies to FIGS. 6 to 8). Values used for providing the graph in FIG. 5 are shown below (Table 1).

TABLE 1

| Al Electrode Width (μm) | Bandwidth | Transmittance | Bandwidth × Transmittance | Bandwidth Change Rate | |
|---|---|---|---|---|---|
| 0 | 1 | 0.989072 | 0.989072033 | 68.8479033 | |
| 0.125 | 9.605988 | 0.948771 | 9.113886246 | 40.9210636 | |
| 0.25 | 11.23027 | 0.908471 | 10.20236742 | 8.57141106 | One |
| 0.5 | 12.26742 | 0.827869 | 10.15581728 | 2.85357779 | Digit |
| 0.75 | 12.65705 | 0.747268 | 9.45821212 | 1.18778116 | |
| 1 | 12.86131 | 0.666667 | 8.574204036 | 0.81700508 | |

By making use of the relationship between Formula 1 or Formula 2, and Formula 3, the width of each of the Al and poly-Si electrodes may be determined appropriately based on the specified sensitivity and response speed of an optical transmission system. More specifically, in FIG. 5, if the specified sensitivity of the optical transmission system is not less than point B and the specified response speed is not less than point A, then selection of a value of Al electrode width/poly-Si electrode width within the range between points C and D satisfies the specifications.

Figure 6:
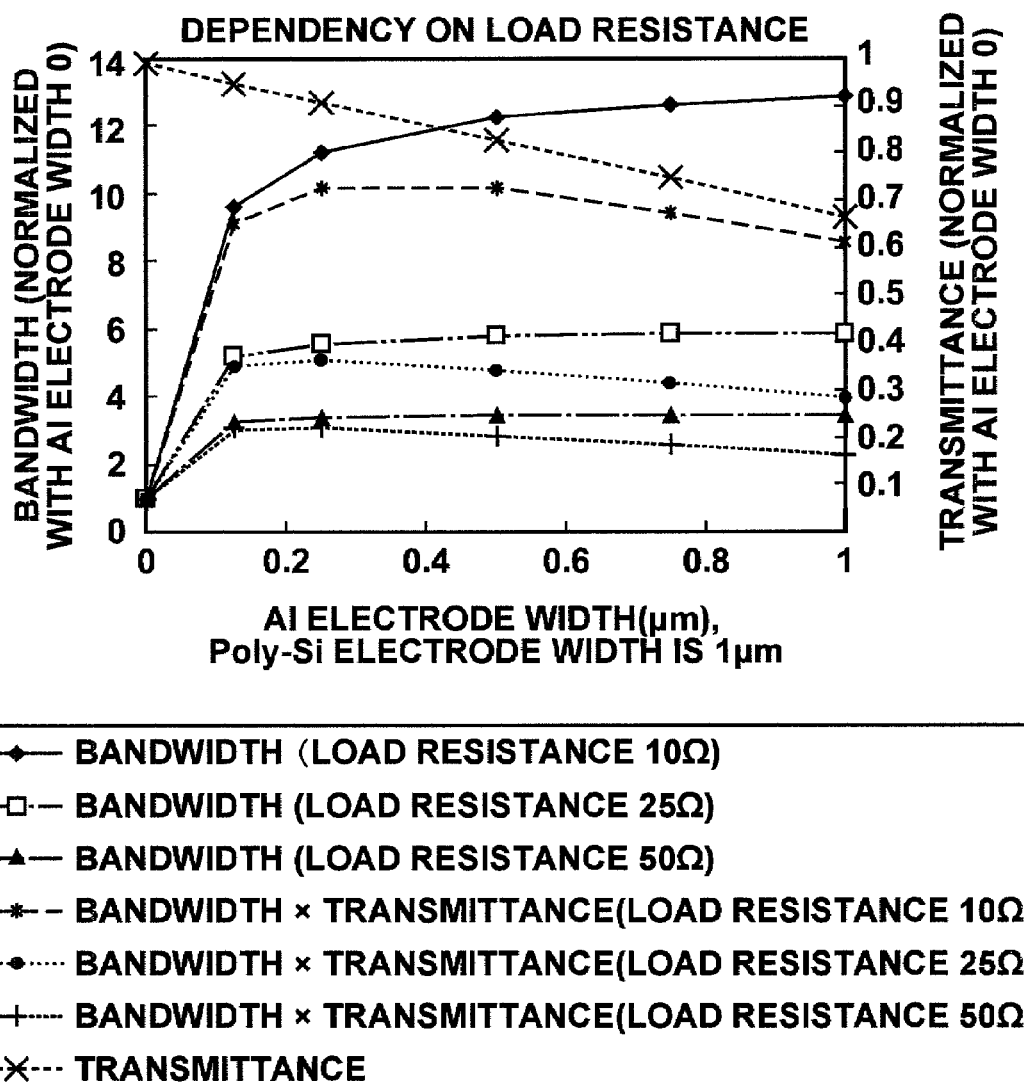
FIG. 6 is a graph illustrating dependency of the bandwidth and the like of the photodiode of the present invention on the load resistance.
Figure 7:
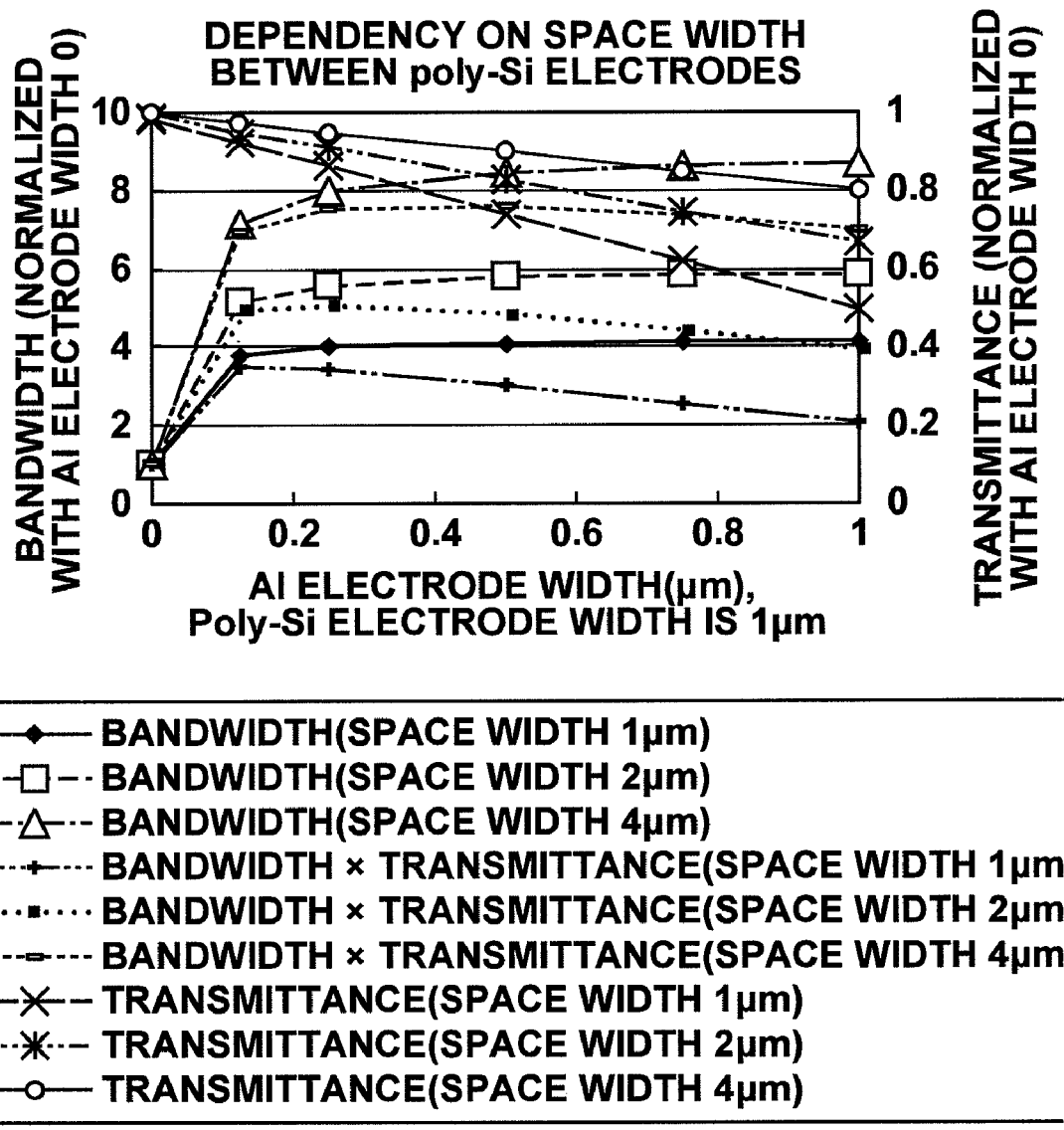
FIG. 7 is a graph illustrating dependency of the bandwidth and the like of the photodiode of the present invention on the space width between the electrodes.

Hereinafter, a preferable value range of Al electrode width/poly-Si electrode width will be discussed in more detail. Firstly, when the photodiode has a square shape, a simulation based on Formula 1 and Formula 2 shows that the parameters having a great impact on the transmittance related to the bandwidth and sensitivity are the magnitude of load resistance and space width between the poly-Si electrodes. Simulation results of dependency of the bandwidth on load resistance and on space width between the poly-Si electrodes with respect to Al electrode width are shown in FIGS. 6 and 7 respectively. Values used for providing the graphs in FIG. 6 and 7 are shown in Tables 2 and 3 below.

TABLE 2

| Al Elect. Width (μm) | Bandwidth (Ω) | | | Transmittance | | | Bandwidth × Transmittance | | |
|---|---|---|---|---|---|---|---|---|---|
| | 10 | 25 | 50 | 10 | 25 | 50 | 10 | 25 | 50 |
| 0 | 1 | 1 | 1 | 0.989072 | 0.989072 | 0.989072 | 0.989072 | 0.989072 | 0.989072 |
| 0.125 | 9.605988 | 5.165334 | 3.239435 | 0.948771 | 0.948771 | 0.948771 | 9.113886 | 4.900721 | 3.073483 |
| 0.25 | 11.23027 | 5.554143 | 3.366124 | 0.908471 | 0.908471 | 0.908471 | 10.20237 | 5.045776 | 3.058025 |
| 0.5 | 12.26742 | 5.771356 | 3.433258 | 0.827869 | 0.827869 | 0.827869 | 10.15582 | 4.777929 | 2.842289 |
| 0.75 | 12.65705 | 5.847586 | 3.456235 | 0.747268 | 0.747268 | 0.747268 | 9.458212 | 4.369714 | 2.582734 |
| 1 | 12.86131 | 5.886461 | 3.467840 | 0.666667 | 0.666667 | 0.666667 | 8.574204 | 3.924307 | 2.311893 |

| Al Elect. Width (μm) | Bandwidth Change Rate | | | |
|---|---|---|---|---|
| | 10 | 25 | 50 | |
| 0 | 68.8479 | 33.32267 | 17.91548 | |
| 0.125 | 40.92106 | 18.21657 | 9.464495 | One |
| | | | | ↕ |
| 0.25 | 8.571411 | 1.989662 | 0.641024 | Digit |
| 0.5 | 2.853578 | 0.586885 | 0.180223 | |
| 0.75 | 1.187781 | 0.230209 | 0.069163 | |
| 1 | 0.817005 | 0.1555 | 0.046417 | |

TABLE 3

| Al Elect. Width (μm) | Bandwidth (um) | | | Transmittance | | | Bandwidth × Transmittance | | |
|---|---|---|---|---|---|---|---|---|---|
| | 1 | 2 | 4 | 1 | 2 | 4 | 1 | 2 | 4 |
| 0 | 1 | 1 | 1 | 0.983608 | 0.989072 | 0.993443 | 0.983608 | 0.989072 | 0.993443 |
| 0.125 | 3.807309 | 5.165334 | 7.148071 | 0.923157 | 0.948771 | 0.969263 | 3.514744 | 4.900721 | 6.928359 |
| 0.25 | 3.995833 | 5.554143 | 7.971758 | 0.862706 | 0.908471 | 0.945082 | 3.447229 | 5.045776 | 7.533969 |
| 0.5 | 4.097274 | 5.771356 | 8.459141 | 0.741804 | 0.827869 | 0.896722 | 3.039774 | 4.777929 | 7.585494 |
| 0.75 | 4.132242 | 5.847586 | 8.635121 | 0.620902 | 0.747268 | 0.848361 | 2.565718 | 4.369714 | 7.325698 |
| 1 | 4.149951 | 5.886461 | 8.725885 | 0.5 | 0.666667 | 0.8 | 2.074976 | 3.924307 | 6.980708 |

| Al Elect. Width (μm) | Bandwidth Change Rate | | | |
|---|---|---|---|---|
| | 1 | 2 | 4 | |
| 0 | 22.45847 | 33.32267 | 49.18456 | |
| 0.125 | 11.98333 | 18.21657 | 27.88703 | One |
| | | | | ↕ |
| 0.25 | 0.956979 | 1.989662 | 4.269516 | Digit |
| 0.5 | 0.272818 | 0.586885 | 1.326725 | |
| 0.75 | 0.105354 | 0.230209 | 0.533489 | |
| 1 | 0.070835 | 0.1555 | 0.363058 | |

In FIGS. 6 and 7, if the point at which bandwidth improvement become gentle is assumed to be the point where the bandwidth change rate goes down by one digit or more, such point is, in either cases, the point where the value of Al electrode width/poly-Si electrode width is 0.25 (Tables 2 and 3). That is, from the viewpoint of bandwidth improvement, it would be said that the width of the opaque Al electrode is preferable to be not less than ¼ of the width of the transparent poly-Si electrode.

In the mean time, as for the transmittance related to the sensitivity, FIGS. 6 and 7 show that the transmittance may fall below 60% when the value of the Al electrode width/poly-Si electrode width is greater than 0.75. For the light having a wavelength of 850 nm which is generally used in optical communications, the quantum efficiency of Ge is about 50%, and that of SiGe is about 30%. Accordingly, when the transmittance is less than 60%, the efficiency may fall behind SiGe which is a material used more widely than pure Ge. This suggests that the value of Al electrode width/poly-Si electrode width is preferable to be not greater than 0.75.

Also, from the viewpoint of the manufacturing process, the value of Al electrode width/poly-Si electrode width is preferable to be not greater than 0.75 and not less than approximately 0.25. The reason is that, when performing annealing after forming the Al electrode, distortion is developed due to difference in thermal expansion coefficient between Al and poly-Si, which is likely to cause damage to the poly-Si electrode, passivation layer and Ge layer (method for manufacturing the electrode will be described later).

To generalize from the above results, (a) when the photodiode has a square shape, it is preferable that the value of Al electrode width/poly-Si electrode width is within the range from approximately ¼ to ¾. For a comb electrode structure (electrode thickness, for example, from 0.25 to 0.5 μm) produced using a standard manufacturing process, a satisfactory result is obtained with respect to the trade-off between the response speed (bandwidth) and sensitivity when the value of Al electrode width/poly-Si electrode width is within the range described above.

Next, description will be made of the case (b) when the photodiode has a circular shape. Simulation results of dependency of the bandwidth on photodiode diameter with respect to Al electrode width are shown in FIG. 8. Values used for providing the graph in FIG. 8 are shown in Table 4 below.

TABLE 4

| Al Elec. Width (μm) | Bandwidth (um) | | | Transmittance | | |
|---|---|---|---|---|---|---|
| | 50 | 100 | 200 | 50 | 100 | 200 |
| 0 | 1 | 1 | 1 | 0.984617 | 0.984617 | 0.984617 |
| 0.125 | 5.765896 | 3.250489 | 2.177067 | 0.92404 | 0.92404 | 0.92404 |
| 0.25 | 7.264353 | 3.931822 | 2.596128 | 0.863462 | 0.863462 | 0.863462 |
| 0.5 | 8.317875 | 4.386683 | 2.87091 | 0.742308 | 0.742308 | 0.742308 |
| 0.75 | 8.763487 | 4.566562 | 2.977113 | 0.621154 | 0.621154 | 0.621154 |
| 1 | 9.00469 | 4.662149 | 3.033217 | 0.5 | 0.5 | 0.5 |

| Al Elec. Width (μm) | Bandwidth × Transmittance | | | Bandwidth Change Rate | | |
|---|---|---|---|---|---|---|
| | 50 | 100 | 200 | 50 | 100 | 200 |
| 0 | 0.984617 | 0.984617 | 0.984617 | 38.12717 | 18.00391 | 9.416535 |
| 0.125 | 5.327916 | 3.00358 | 2.011696 | 25.05741 | 11.72729 | 6.384512 |
| 0.25 | 6.272496 | 3.39498 | 2.241659 | 8.100868 | 3.635053 | 2.225809 |
| 0.5 | 6.174427 | 3.256271 | 2.131101 | 2.998268 | 1.26948 | 0.761971 |
| 0.75 | 5.443476 | 2.836539 | 1.849246 | 1.373631 | 0.550932 | 0.324613 |
| 1 | 4.502345 | 2.331074 | 1.516608 | 0.964813 | 0.382349 | 0.224414 |

In FIG. 8, if the point at which bandwidth improvement become gentle is assumed to be the point where the bandwidth change rate goes down by one digit or more, such point is, also in this case, the point where the value of Al electrode width/poly-Si electrode width is 0.25 (Table 4). That is, from the viewpoint of bandwidth improvement, it would be said that the width of Al opaque electrode is preferable to be not less than ¼ of the width of the transparent poly-Si electrode.

In the mean time, as for the transmittance related to the sensitivity, FIG. 8 shows that the transmittance may fall below 60% when the value of the Al electrode width/poly-Si electrode width is greater than 0.75. For the light having a wavelength of 850 nm which is generally used in optical communications, the quantum efficiency of Ge is about 50%, and that of SiGe is about 30%. Accordingly, when the transmittance is less than 60%, the efficiency may fall behind SiGe which is a material used more widely than pure Ge. This suggests that the value of Al electrode width/poly-Si electrode width is preferable to be not greater than 0.75.

The condition on the manufacturing process is identical to that of (a) when the photodiode has a square shape, so that also from the viewpoint of the manufacturing process, the value of Al electrode width/poly-Si electrode width is preferable to be not greater than 0.75 and not less than approximately 0.25.

To generalize from the above results, (b) when the photodiode has a circular shape, it is preferable that the value of Al electrode width/poly-Si electrode width is within the range from approximately ¼ to ¾. For a comb electrode structure (electrode thickness, for example, from 0.25 to 0.5 μm) produced using a standard manufacturing process, a satisfactory result is obtained with respect to the trade-off between the response speed (bandwidth) and sensitivity when the value of Al electrode width/poly-Si electrode width is within the range described above.

Here, examples of optimum sizes of the respective sections obtainable based on the concept described above will be provided below. Note that negative electrodes of the poly-Si electrodes are doped with P at a density of approximately $1 \times 10^{19}$ to $1 \times 10^{20}/cm^3$, and positive electrodes are doped with B at a density of approximately $1 \times 10^{19}$ to $1 \times 10^{20}/cm^3$. In addition, the following parameters are assumed.

$W_{Al}$: width of Al electrode=0.25 to 1 μm
$W_{poly}$: width of poly-Si electrode=0.5 to 2 μm
$W_{Sp}$: spacing between poly-Si electrodes=1 to 4 μm
$d_{Al}$: thickness of Al electrode=0.25 to 0.5 μm
$d_{poly}$: thickness of poly-Si electrode=0.25 to 0.5 μm
L or (D): length of the comb electrode (or diameter)=50 to 400 μm
$R_0$: load resistance of an external circuit=10 to 50Ω

In this case, $W_{Al}$: width of Al electrode=0.25 to 1 μm, and $W_{poly}$: width of poly-Si electrode=0.5 to 2 μm are particularly preferable values. Therefore, it is only necessary to select and set the widths of the respective electrodes from the value ranges in such a manner so that the ratio of the former to the latter falls within the range of ¼ to ¾.

Note that the structure of the present embodiment may further include a barrier layer made of Ti, TiN or TaN, or a contact layer made of $TiSi_2$, $TaSi_2$, or $CoSi_2$ between the transparent electrode 13a and opaque electrode 13b. As for the material of the opaque electrode 13b, for example, Al—Si, Ni, Ta, Cu, Ti and TiN may be used other than Al described above.

Next a method for manufacturing the photodiode of the present invention will be described with reference to FIGS. 9A to 9D. Here, the description will be made of a case in which a Si substrate is used as the semiconductor substrate 11, and the active layer 12 is formed of Ge.

1) Forming the Ge active layer 12 on the surface of the Si substrate 11 by epitaxial growth. More specifically, this step includes performing epitaxial growth at a low temperature (360° C.) using an LP (preferably, UHV) CVD system to grow a Ge thin film (film thickness of 50 to 100 nm), and performing epitaxial growth at a high temperature (700 to 750° C.) using an LP (preferably, UHV) CVD system to further grow a Ge thin film (film thickness of 0.4 to 1 μm). Note that the step may also use selective epitaxial growth.

2a) Performing annealing for thirty minutes at 850° C. using a furnace.

2b) Performing annealing for three minutes at 850° C. using RTP (rapid thermal annealer).

2c) The substrate 11 may further be subjected to a cyclic annealing between 700 to 900° C. for about ten times.

Figure 9A:
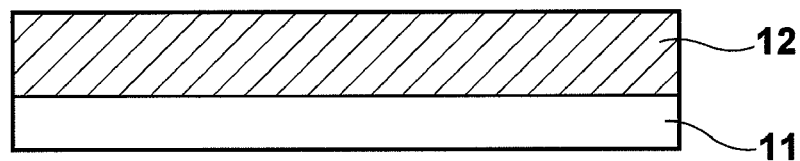
FIGS. 9A to 9D illustrate an example process for manufacturing the photodiode of the present invention.

The state of the substrate 11 undergone the manufacturing steps so far is illustrated in FIG. 9A. In the drawing, the reference numeral 11 indicates the substrate and reference numeral 12 indicates the active layer 12.

3) Depositing a dielectric film of $SiO_2$, SiON, or the like, as a protection film.

Steps that follow differ depending on which structure is to be provided among an ordinary MSM structure, an ordinary lateral PIN structure, and the lateral PIN structure described in U.S. Pat. No. 5,777,390, therefore, steps for each of the there cases will be described successively.

(MSM Structure)

4) Etching a transparent electrode pattern, e.g., a poly-Si electrode pattern, in the protection layer.

5) Depositing a metal of transparent electrodes, e.g., poly-Si, by CVD or the like.

6) Forming the transparent electrode, e.g., poly-Si electrodes, by etching.

7) Depositing a dielectric film of $SiO_2$, SiON, or the like, as a protection film.

8) Etching an opaque electrode pattern, e.g., an Al electrode pattern, in the protection layer.

9) Depositing a metal of opaque electrodes, e.g., Al, by sputtering or the like.

10) Forming opaque electrodes, e.g., Al electrodes, by etching.

11) Depositing a dielectric film of $SiO_2$, SiON, or the like, as a protection film (passivation layer).

Figure 9B:
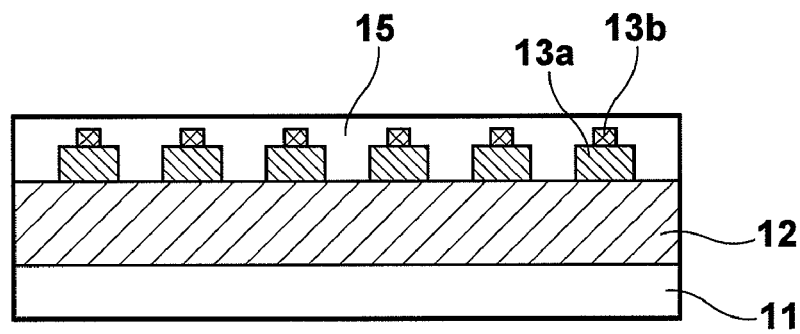

The state of the substrate 11 undergone the manufacturing steps so far is illustrated in FIG. 9B. In the drawing, the reference numeral 13a indicates the transparent electrodes, reference numeral 13b indicates the opaque electrodes, and reference numeral 15 indicates the passivation layer.

(Ordinary Lateral PIN Structure)

4) Etching an N-type contact region pattern in the protection layer.

5) Implanting an N-type ion (P or As).

6) Etching a P-type contact region pattern in the protection layer.

7) Implanting a P-type ion (B-).

8) Depositing a dielectric film of $SiO_2$, SiON, or the like, as a protection film.

9) Performing annealing at 650 to 700° C. to recover crystal damage caused by ion implantation.

10) Etching a transparent electrode pattern, e.g., poly-Si electrode pattern, in the protection layer.

11) Depositing a metal of transparent electrodes, e.g., poly-Si, by CVD or the like.

12) Forming the transparent electrode, e.g., poly-Si electrodes, by etching.

13) Depositing a dielectric film of $SiO_2$, SiON, or the like, as a protection film.

14) Etching an opaque electrode pattern, e.g., an Al electrode pattern, in the protection layer.

15) Depositing a metal of opaque electrodes, e.g., Al, by sputtering or the like.

16) Forming opaque electrodes, e.g., Al electrodes, by etching.

17) Depositing a dielectric film of $SiO_2$, SiON, or the like, as a protection film (passivation layer).

Figure 9C:
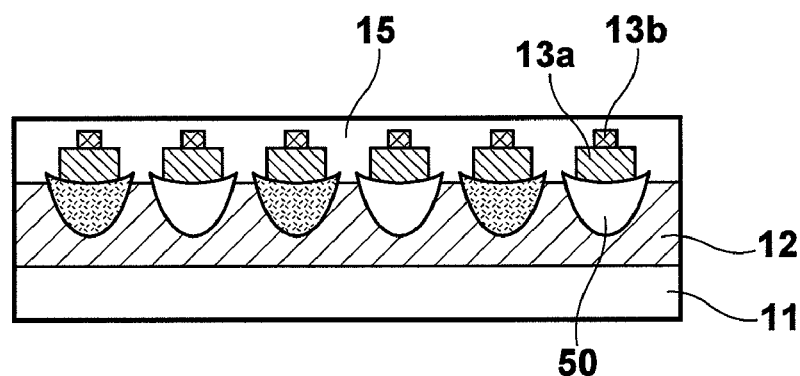

The state of the substrate 11 undergone the manufacturing steps so far is illustrated in FIG. 9C. In the drawing, the reference numeral 50 indicates the contact regions, in which distinction between N-type and P-type contact regions is made by dotted regions and those without dots.

(Lateral PIN Structure Having a Hybrid Electrode Described in U.S. Pat. No. 5,777,390)

4) Etching a contact region pattern in the protection layer.

5) Depositing poly-Si of transparent electrodes by CVD or the like.

6) Etching an N-type contact region pattern in the protection layer.

7) Implanting an N-type ion (P or As).

8) Etching a P-type contact region pattern in the protection layer.

9) Implanting a P-type ion (B-).

10) Depositing a dielectric film of $SiO_2$, SiON, or the like, as a protection film.

11) Performing annealing at 650 to 700° C. to recover crystal damage caused by ion implantation.

12) Etching a transparent electrode pattern, e.g., poly-Si electrode pattern, in the protection layer.

13) Forming transparent electrodes, e.g., poly-Si electrodes.

14) Depositing a dielectric film of $SiO_2$, SiON, or the like, as a protection film.

15) Etching an opaque electrode pattern, e.g., Al electrode pattern, in the protection layer.

16) Depositing a material of opaque electrodes e.g., Al, by sputtering or the like.

17) Forming opaque electrodes, e.g., Al electrodes, by etching.

18) Depositing a dielectric film of $SiO_2$, SiON, or the like, as a protection film (passivation layer).

Figure 9D:
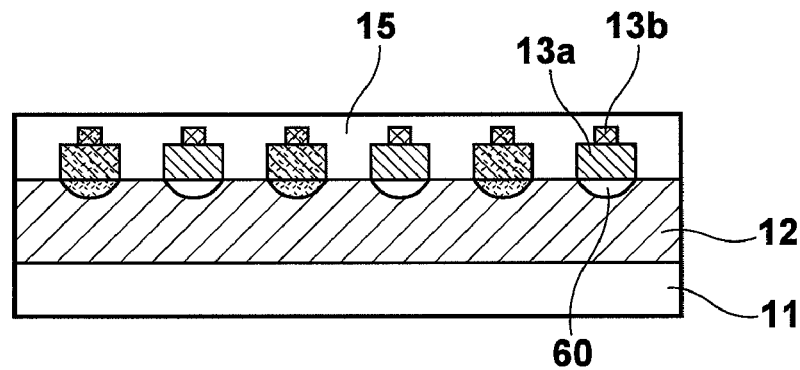

The state of the substrate 11 undergone the manufacturing steps so far is illustrated in FIG. 9D. In the drawing, the reference numeral 60 indicates the contact regions, in which distinction between N-type and P-type contact regions is made by the regions with dots and those without dots.

In order to obtain good mechanical and electrical contact between the transparent electrode 13a, made of poly-Si, and opaque electrode, made of Al, formed on the transparent electrode 13a, it is necessary to perform annealing at 450° C. after vapor depositing Al. In this case, following the vapor deposition of an Al film 13B as illustrated in FIG. 10A, there may be two alternative manufacturing step sequences, one of which is to form the opaque electrode 13b by etching first, and then to perform annealing as illustrated in FIGS. 10B and 10C, and the other of which is to perform annealing on the Al film 13B first, and then to form the opaque electrode 13b by etching as illustrated in FIGS. 13D and 13E.

According to the research made by the inventors of the present invention, the former, illustrated in FIGS. 10B and 10C, may provide more satisfactory results. That is, the research revealed that the latter, illustrated in FIGS. 10D and 10E, gives stress to the transparent electrode 13a sandwiched by the Al film 13B and active layer 12 by the heating and cooling during the annealing, which is likely to cause defects around the transparent electrode 13a.

What is claimed is:

1. A lateral photodiode comprising:
   a semiconductor substrate;
   an active region formed on the semiconductor substrate; and
   a comb electrode connected to the active region,
   wherein:
   each of a plurality of electrode fingers constituting the comb electrode includes a transparent electrode contacting the active region, and an opaque electrode formed on the transparent electrode; and
   the width of the opaque electrode is set smaller than that of the transparent electrode.

2. The photodiode according to claim 1, wherein the transparent electrode is made of poly-Si, and the opaque electrode is made of at least one of the materials selected from the group consisting of Al, AlSi, Ni, Ta, Cu, Ti, and TiN.

3. The photodiode according to claim 2, wherein the width of the opaque electrode is in the range of ¼ to ¾ of the width of the transparent electrode.

4. The photodiode according to claim 2, wherein an active layer on which the active region is formed is made of Ge or SiGe.

5. The photodiode according to claim 3, wherein an active layer on which the active region is formed is made of Ge or SiGe.

6. The photodiode according to claim 2, wherein a barrier layer made of Ti, TiN, or TaN, and a contact layer made of $TiSi_2$, $TaSi_2$, or $CoSi_2$ are formed between the transparent electrode and the opaque electrode.

7. The photodiode according to claim 3, wherein a barrier layer made of Ti, TiN, or TaN, and a contact layer made of $TiSi_2$, $TaSi_2$, or $CoSi_2$ are formed between the transparent electrode and the opaque electrode.

8. The photodiode according to claim 4, wherein a barrier layer made Ti, TiN, or TaN, and a contact layer made of $TiSi_2$, $TaSi_2$, or $CoSi_2$ are formed between the transparent electrode and the opaque electrode.

9. A method of manufacturing the photodiode according to claim 1, comprising the steps of:
   depositing a material of the opaque electrode on the entire surface of the transparent electrode;
   etching the material of the opaque electrode into a predetermined pattern; and
   annealing the material of the opaque electrode.

10. A method of manufacturing the photodiode according to claim 2, comprising the steps of:
    depositing a material of the opaque electrode, which is one of the materials selected from the group consisting of Al, AlSi, Ni, Ta, Cu, Ti, and TiN, on the entire surface of the transparent poly-Si electrode;
    etching the material of the opaque electrode into a predetermined pattern; and
    annealing the material of the opaque electrode.

* * * * *